(12) United States Patent
Fulkerson

(10) Patent No.: US 6,794,925 B1
(45) Date of Patent: Sep. 21, 2004

(54) COLD SPARE CIRCUIT FOR CMOS OUTPUT CIRCUIT

(75) Inventor: David E. Fulkerson, Chanhassen, MN (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/463,313

(22) Filed: Jun. 17, 2003

(51) Int. Cl.[7] .............................................. G06F 11/16
(52) U.S. Cl. ...................... 327/526; 327/112; 327/391; 326/13; 326/87
(58) Field of Search .............................. 327/108, 109, 327/112, 379, 389, 391, 427, 526, 581; 326/10, 13, 81, 83, 87; 330/124 D

(56) References Cited

U.S. PATENT DOCUMENTS 6,272,577 B1 * 8/2001 Leung et al. ................. 326/83
6,320,433 B1 * 11/2001 Hinterscher ................. 327/112
6,392,440 B2 * 5/2002 Nebel ............................ 326/81

* cited by examiner

Primary Examiner—Long Nguyen
(74) Attorney, Agent, or Firm—Schiff Hardin LLP

(57) ABSTRACT

A first cold spare circuit has first and second transistors, and a second cold spare circuit has third and fourth transistors. The first transistor has a gate controlled by a function of a first chip. A second transistor has its source and drain connected in series with the source and drain of the first transistor between the output and a first potential terminal. A third transistor has a gate controlled by a function of a second chip. A fourth transistor has its source and drain connected in series with the source and drain of the third transistor between the output and a second potential terminal. A first control circuit controls the gate of the second transistor and a second control circuit controls the gate of the fourth transistor so as to turn on one of the second and fourth transistors at a time.

22 Claims, 2 Drawing Sheets

COLD SPARE CIRCUIT FOR CMOS OUTPUT CIRCUIT

TECHNICAL FIELD OF THE INVENTION

The present invention relates to a cold spare redundant circuit capable of providing the desired output if the active circuit becomes unreliable.

BACKGROUND OF THE INVENTION

Many circuit applications require the need for redundancy in which a particular function is provided using redundant circuits such that, if one of circuits fails to provide the desired function, at least one of the other redundant circuits can take over to provide that function.

Redundant circuits may operate in either an active mode or a standby mode. In the active mode, all of the redundant circuits are active and operate in parallel such that, if one of the redundant circuits fails, one or more identical paths exist to continue the function being provided. Also, plural redundant circuits can be operated in the active mode such that a vote is taken of their outputs and the output that is in the majority is used to provide the desired function.

In the standby mode, one of the redundant circuits is active to provide the desired function, but the other redundant circuits are on standby. That is, the outputs of the redundant circuits on standby are not used for any purpose. When the active circuit fails, one of the other redundant circuits is made active. The redundant circuits on standby are either hot spare circuits or cold spare circuits. Hot spare circuits are redundant circuits that are powered up but that are not switched to the output. Cold spare circuits are redundant circuits that are not powered up and provide no signal to the output.

In the case of cold spare redundant circuits, the outputs of the cold spare redundant circuits are frequently tied to the output of the active circuit. Therefore, the cold spare redundant circuits could conceivably electrically interfere with the active circuit.

The present invention is directed to a cold spare circuit that does not electrically interfere with the active circuit.

SUMMARY OF THE INVENTION

According to one aspect of the present invention, a redundant system having an output comprises first, second, third, and fourth transistors and first and second control circuits. The first transistor has a gate, a source, and a drain, and the gate of the first transistor is controlled by a function of a first chip. The second transistor has a gate, a source, and a drain, and the source and drain of the first transistor and the source and drain of the second transistor are connected in series between the output and a first potential terminal. The third transistor has a gate, a source, and a drain, and the gate of the third transistor is controlled by a function of a second chip. The fourth transistor has a gate, a source, and a drain, and the source and drain of the third transistor and the source and drain of the fourth transistor are connected in series between the output and a second potential terminal. The first control circuit is connected to the gate of the second transistor and the second control circuit is connected to the gate of the fourth transistor so as to turn on one of the second and fourth transistors at a time.

According to another aspect of the present invention, a method is provided to control first and second cold spare circuits. The first cold spare circuit comprises first and second transistors. The first transistor has a gate, a source, and a drain, and the gate of the first transistor is controlled by a function of a first chip. The second transistor has a gate, a source, and a drain, and the source and drain of the first transistor and the source and drain of the second transistor are connected in series between an output and a first potential terminal. The second cold spare circuit comprises third and fourth transistors. The third transistor has a gate, a source, and a drain, and the gate of the third transistor is controlled by a function of a second chip that is redundant of the first chip. The fourth transistor has a gate, a source, and a drain, and the source and drain of the third transistor and the source and drain of the fourth transistor are connected in series between the output and a second potential terminal. The method comprises the following: controlling the second and fourth transistors so that only one of the first and second transistors is on at a time; providing a non-zero potential to one of the first and second potential terminals corresponding to the one of the second and fourth transistors that is on; and, providing a zero potential to the other of the first and second potential terminals corresponding to the one of the second and fourth transistors that is off.

According to still another aspect of the present invention, a method is provided to control a cold spare circuit. The cold spare circuit comprises first and second transistors. The first transistor has a gate, a source, and a drain, and the gate of the first transistor is controlled by a function of a redundant chip. The second transistor has a gate, a source, and a drain, and the source and drain of the first transistor and the source and drain of the second transistor are connected in series between an output and a potential terminal. The method comprises the following: controlling the second transistor so that the cold spare circuit is on or off; providing a non-zero potential to the potential terminal when the cold spare circuit is controlled to be on; and, providing a zero potential to the potential terminal when the cold spare circuit is controlled to be off.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
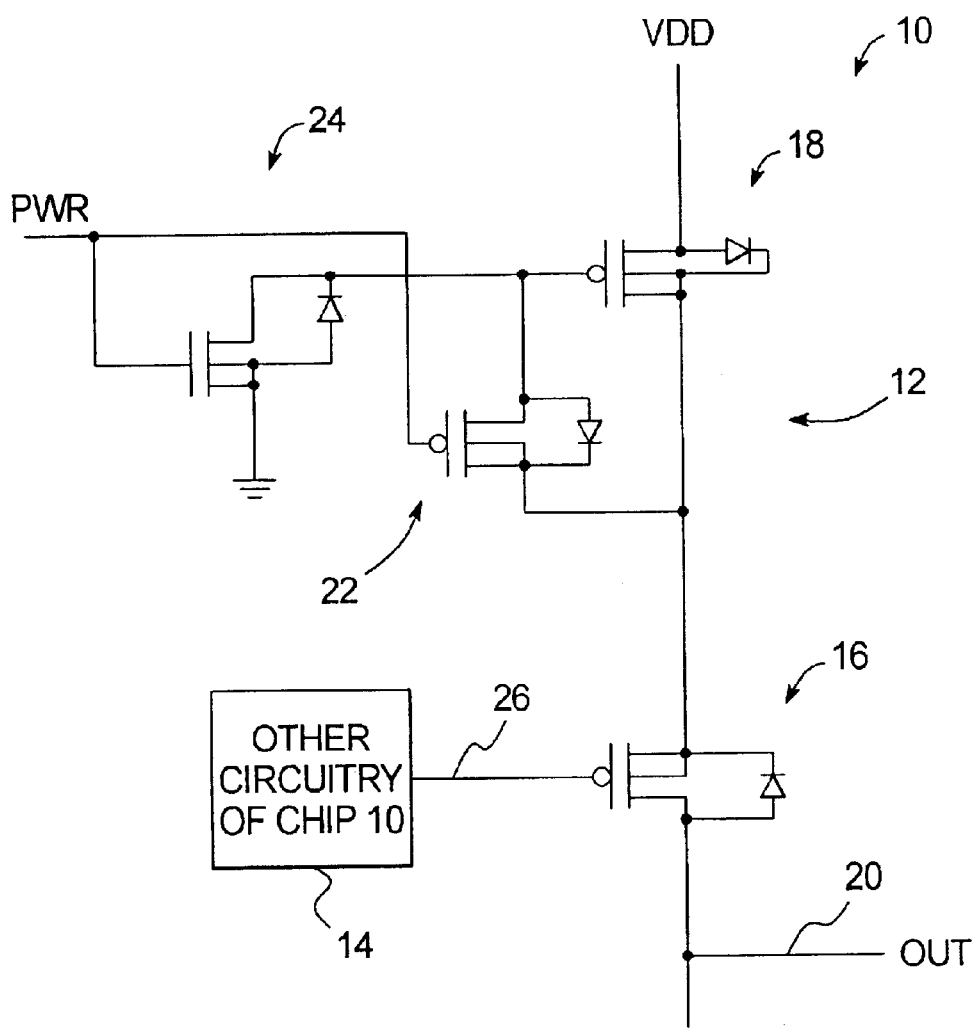
FIG. 1 shows a cold spare circuit according to an embodiment of the present invention: and, FIG. 2 shows redundant cold spare circuits each arranged in accordance with the cold spare circuit of FIG. 1.

As shown in FIG. 1, a chip 10 includes a cold spare circuit 12 and other chip circuitry 14. The other chip circuitry 14 represents any chip function or functions for which redundancy is desired. Thus, the other chip circuitry 14 represents any chip to which it is desired to add the cold spare circuit of the present invention. The chip 10 may be any chip such as a CMOS chip or a Low Voltage Differential Signaling (LVDS) chip. The cold spare circuit 12 is used to provide an output for the chip 10.

The cold spare circuit 12 includes p-channel transistors 16, 18, and 22 and an n-channel transistor 24. The p-channel transistor 16 is the main output pull up transistor for the cold spare circuit 12. The p-channel transistor 16 is connected in series with the p-channel transistor 18 between a potential terminal $V_{DD}$ and an output 20 of the cold spare circuit 12. Accordingly, the source of the p-channel transistor 18 is connected to the potential terminal $V_{DD}$, the drain of the p-channel transistor 18 is connected to the source of the p-channel transistor 16, and the drain of the p-channel transistor 16 is connected to the output 20.

The source of the n-channel transistor 24 is connected to the gate of the p-channel transistor 18 and to the source of the p-channel transistor 22. The drain of the n-channel transistor 24 is connected to ground, and the drain of the p-channel transistor 22 is connected to the drain of the p-channel transistor 18 and to the source of the p-channel transistor 16. The gates of the n-channel transistor 24 and of the p-channel transistor 22 are connected to a signal terminal PWR that receives a PWR (power) signal.

The other chip circuitry 14 has an output 26 that drives the cold spare circuit 12. Because of the cold spare circuit 12, the output 26 of the other chip circuitry 14 is coupled to the gate of the p-channel transistor 16. Accordingly, the p-channel transistor 16 is controlled by the output 26 of the other chip circuitry 14.

When the PWR signal is high, the cold spare circuit 12 is active. In this case, the n-channel transistor 24 is on, which pulls the gate of the p-channel transistor 18 low to turn on the p-channel transistor 18. When the p-channel transistor 18 is on, the source of the p-channel transistor 16 is pulled high so that it can act as a pull up transistor for the output 20. Therefore, the p-channel transistor 16 is conditioned to drive the output 20 under control of the output 26 from the other chip circuitry 14.

When the PWR signal is low, the cold spare circuit 12 is in its off mode. In this case, the n-channel transistor 24 is off and the p-channel transistor 22 is on. Accordingly, the gate voltage of the p-channel transistor 18 is pulled to the drain voltage of the p-channel transistor 18. Therefore, the p-channel transistor 18 is off and the p-channel transistor 16 does not drive the output 20.

Figure 2:
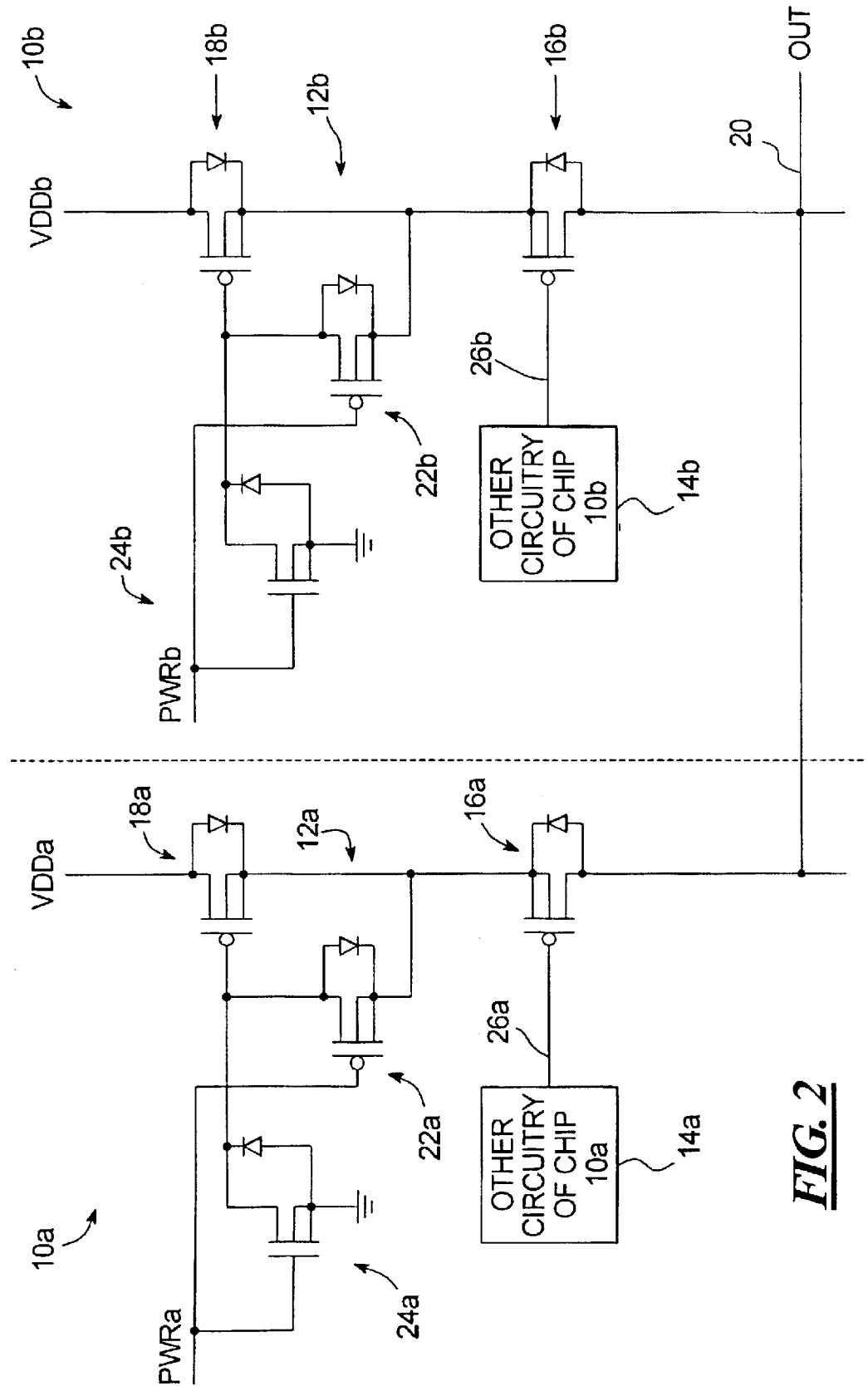

As shown FIG. 2, first and second cold spare circuits 12a and 12b are useable to provide redundant operation of corresponding first and second chips 10a and 10b. The first chip 10a includes the first cold spare circuit 12a and other chip circuitry 14a. The other chip circuitry 14a represents any chip function or functions for which redundancy is desired. The second chip 10b includes the second cold spare circuit 12b and other chip circuitry 14b. The other chip circuitry 14b provides the same chip function or functions as the other chip circuitry 14a. Thus, the other chip circuitry 14a and 14b are redundant circuits to which are added the first and second cold spare circuits 12a and 12b.

The first cold spare circuit 12a includes p-channel transistors 16a, 18a, and 22a and an n-channel transistor 24a. Similarly, the second cold spare circuit 12b includes p-channel transistors 16b, 18b, and 22b and an n-channel transistor 24b. As can be seen, the first and second cold spare circuits 12a and 12b have the same configuration as the cold spare circuit 12 of FIG. 1.

The p-channel transistor 16a is the main output pull up transistor for the first cold spare circuit 12a. The p-channel transistor 16a is connected in series with a p-channel transistor 18a between a first potential terminal $V_{DDa}$ and the output 20. Accordingly, the source of the p-channel transistor 18a is connected to the first potential-terminal $V_{DDa}$, the drain of the p-channel transistor 18a is connected to the source of the p-channel transistor 16a, and the drain of the p-channel transistor 16a is connected to the output 20.

The source of the n-channel transistor 24a is connected to the gate of the p-channel transistor 18a and to the source of the p-channel transistor 22a. The drain of the n-channel transistor 24a is connected to ground, and the drain of the p-channel transistor 22a is connected to the drain of the p-channel transistor 18a and to the source of the p-channel transistor 16a. The gates of the n-channel transistor 24a and of the p-channel transistor 22a are connected to a first PWR signal terminal PWRa.

The other chip circuitry 14a has an output 26a that drives the first cold spare circuit 12a. Because of the first cold spare circuit 12a, the output 26a of the other chip circuitry 14a is coupled to the gate of the p-channel transistor 16a. Accordingly, the p-channel transistor 16a is controlled by the output 26a of the other chip circuitry 14a.

The p-channel transistor 16b is the main output pull up transistor for the second cold spare circuit 12b. The p-channel transistor 16b is connected in series with a p-channel transistor 18b between a second potential terminal $V_{DDb}$ and the output 20. Accordingly, the source of the p-channel transistor 18b is connected to the second potential terminal $V_{DDb}$, the drain of the p-channel transistor 18b is connected to the source of the p-channel transistor 16b, and the drain of the p-channel transistor 16b is connected to the output 20.

The source of the n-channel transistor 24b is connected to the gate of the p-channel transistor 18b and to the source of the p-channel transistor 22b. The drain of the n-channel transistor 24b is connected to ground, and the drain of the p-channel transistor 22b is connected to the drain of the p-channel transistor 18b and to the source of the p-channel transistor 16b. The gates of the n-channel transistor 24b and of the p-channel transistor 22b are connected to the second PWR signal terminal PWRb.

The other chip circuitry 14b has an output 26b that drives the second cold spare circuit 12b. Because of the second cold spare circuit 12b, the output 26b of the other chip circuitry 14b is coupled to the gate of the p-channel transistor 16b. Accordingly, the p-channel transistor 16b is controlled by the output 26b of the other chip circuitry 14b.

One of the first and second cold spare circuits 12a and 12b is active and, therefore, has its corresponding one of the first and second potential terminals $V_{DDa}$ and $V_{DDb}$ at the normal positive value. The other of the first and second cold spare circuits 12a and 12b is the cold spare circuit and, therefore, has its it corresponding other one of the first and second potential terminals $V_{DDa}$ and $V_{DDb}$ at 0 volts. For example, the first cold spare circuit 12a may be active and the second cold spare circuit 12b may be the cold spare circuit. If so, the PWR signal on the first PWR signal terminal PWRa is high, and the PWR signal on the second PWR signal terminal PWRb is low. Also, the potential on the first potential terminal $V_{DDa}$ is non-zero (such as at full voltage), and the potential on the second potential terminal $V_{DDb}$ is at 0 volts.

If the first chip 10a has a reliability problem, the first chip 10a is disconnected from the output 20 by ramping down to 0 volts the potential on the first potential terminal $V_{DDa}$ connected to the source of the p-channel transistor 18a, and ramping up to full voltage the potential on the second potential terminal $V_{DDb}$ connected to the source of the p-channel transistor 18b. Accordingly, the redundant second chip 10b is switched by way of the p-channel transistor 16b to the output 20.

Also, when the reliability of the first cold spare circuit 12a becomes a problem, the PWR signal on the first PWR signal terminal PWRa is switched off just prior to ramping down the potential on the first potential terminal $V_{DDa}$. This power off condition puts the first cold spare circuit 12a into a tri-state (high impedance) mode. Accordingly, in order to not upset any stored data tied to the output 20, the first cold spare circuit 12a ideally will not induce significant current into or out of the output 20 while the potential on the first potential terminal $V_{DDa}$ is ramping down.

If the source of the p-channel transistor 16a were tied directly to the first potential terminal $V_{DDa}$ when the first cold spare circuit 12a is put into the cold spare mode as described above, the parasitic drain-to-body diode of the p-channel transistor 16a (shown by diode symbols in FIGS. 1 and 2) would turn on when the output 20 is high and the potential on the first potential terminal $V_{DDa}$ is 0 volts. Accordingly, this parasitic diode would pull a significant and undesired current from the output 20. Also, if the gate of the p-channel transistor 16a of the first cold spare circuit 12a were low, the p-channel transistor 16a would turn on in the inverse mode (i.e., with its drain acting as a source and drawing current from the output 20), thus also drawing undesired current from the output 20. The p-channel transistor 18a blocks this current in the cold spare mode.

As described above, when the first cold spare circuit 12a is switched to its cold spare mode, the PWR signal on the first PWR signal terminal PWRa is low. Similarly, when the second cold spare circuit 12b is switched to its active mode, the PWR signal on the second PWR signal terminal PWRb is high. When the PWR signal is low on the first PWR signal terminal PWRa, the n-channel transistor 24a is off and the p-channel transistor 22a is on. Accordingly, the gate voltage of the p-channel transistor 18a is pulled to the drain voltage of the p-channel transistor 18a. Therefore, the p-channel transistor 18a is off and the p-channel transistor 16a does not drive the output 20. Thus, the p-channel transistor 16a cannot turn on in the inverse mode when the potential on the first potential terminal $V_{DDa}$ is at 0 volts or, during ramp down, at some voltage between 0 volts and the normal positive operating voltage. The body voltage of the p-channel transistor 16a is tied to the drain, thus ensuring that its parasitic diode does not turn on the p-channel transistor 16a during cold spare mode.

Certain modifications of the present invention have been discussed above. Other modifications will occur to those practicing in the art of the present invention. For example, FIG. 2 shows only two cold spare circuits connected to the output 20. However, more than two cold spare circuits may be used if additional redundancy is desired.

Also, although the first potential terminal $V_{DDa}$, as described above, is ramped down to 0 volts and the second potential terminal $V_{DDb}$, as described above, is ramped up to full voltage, the first potential terminal $V_{DDa}$ could instead be ramped up to 0 volts and the second potential terminal $V_{DDb}$ could instead be ramped down to full voltage.

Moreover, the cold spare circuits are shown in the drawings as being incorporated into their corresponding chips. For example, the cold spare circuit 12 is part of the chip 10. Alternatively, the cold spare circuit 12 may be a circuit separate from the chip 10. In this case, the block 14 identified as other chip circuitry would instead be identified as the chip. Similarly, the first and second cold spare circuits 12a and 12b may be circuits separate from their corresponding chips 10a and 10b.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

What is claimed is:

1. A redundant system having an output comprising:
    a first transistor having a gate, a source, and a drain, wherein the gate of the first transistor is controlled by a function of a first chip;
    a second transistor having a gate, a source, and a drain, wherein the source and drain of the first transistor and the source and drain of the second transistor are connected in series between the output and a first potential terminal;
    a third transistor having a gate, a source, and a drain, wherein the gate of the third transistor is controlled by a function of a second chip, wherein the first and second chips are redundant chips;
    a fourth transistor having a gate, a source, and a drain, wherein the source and drain of the third transistor and the source and drain of the fourth transistor are connected in series between the output and a second potential terminal; and,
    a first control circuit connected to the gate of the second transistor and a second control circuit connected to the gate of the fourth transistor so as to turn on one of the second and fourth transistors at a time.

2. The redundant system of claim 1 wherein the first potential terminal is at a non-zero potential when the second transistor is on and is otherwise at a zero potential, and wherein the second potential terminal is at a non-zero potential when the fourth transistor is on and is otherwise at a zero potential.

3. The redundant system of claim 1 wherein the source of the second transistor is connected to the first potential terminal, wherein the drain of the second transistor is connected to the source of the first transistor, wherein the drain of the first transistor is connected to the output, wherein the source of the fourth transistor is connected to the second potential terminal, wherein the drain of the fourth transistor is connected to the source of the third transistor, and wherein the drain of the third transistor is connected to the output.

4. The redundant system of claim 3 wherein the first potential terminal is at a non-zero potential when the second transistor is on and is otherwise at a zero potential, and wherein the second potential terminal is at a non-zero potential when the fourth transistor is on and is otherwise at a zero potential.

5. The redundant system of claim 3 wherein the first control circuit comprises fifth and sixth transistors, wherein each of the fifth and sixth transistors comprises a gate, a source, and a drain, wherein the source and drain of the fifth transistor are connected between ground and the gate of the second transistor, wherein the source and drain of the sixth transistor are connected between the gate and drain of the second transistor, wherein the gates of fifth and sixth transistors are connected to a first PWR signal terminal, wherein the second control circuit comprises seventh and eighth transistors, wherein each of the seventh and eighth transistors comprises a gate, a source, and a drain, wherein the source and drain of the seventh transistor are connected between ground and the gate of the fourth transistor, wherein the source and drain of the eighth transistor are connected between the gate and drain of the fourth transistor, wherein the gates of seventh and eighth transistors are connected to a second PWR signal terminal, and wherein only one of the first and second PWR signal terminals is active at a time.

6. The redundant system of claim 5 wherein the first potential terminal is at a non-zero potential when the second transistor is on and is otherwise at a zero potential, and wherein the second potential terminal is at a non-zero potential when the fourth transistor is on and is otherwise at a zero potential.

7. The redundant system of claim 1 wherein the first and second transistors comprise respective p-channel transistors.

8. The redundant system of claim 7 wherein the first potential terminal is at a non-zero potential when the second transistor is on and is otherwise at a zero potential, and wherein the second potential terminal is at a non-zero potential when the fourth transistor is on and is otherwise at a zero potential.

9. The redundant system of claim 7 wherein the source of the second transistor is connected to the first potential terminal, wherein the drain of the second transistor is connected to the source of the first transistor, wherein the drain of the first transistor is connected to the output, wherein the source of the fourth transistor is connected to the second potential terminal, wherein the drain of the fourth transistor is connected to the source of the third transistor, and wherein the drain of the third transistor is connected to the output.

10. The redundant system of claim 9 wherein the first potential terminal is at a non-zero potential when the second transistor is on and is otherwise at a zero potential, and wherein the second potential terminal is at a non-zero potential when the fourth transistor is on and is otherwise at a zero potential.

11. The redundant system of claim 9 wherein the first control circuit comprises fifth and sixth transistors, wherein each of the fifth and sixth transistors comprises a gate, a source, and a drain, wherein the source and drain of the fifth transistor are connected between ground and the gate of the second transistor, wherein the source and drain of the sixth transistor are connected between the gate and drain of the second transistor, wherein the gates of fifth and sixth transistors are connected to a first PWR signal terminal, wherein the second control circuit comprises seventh and eighth transistors, wherein each of the seventh and eighth transistors comprises a gate, a source, and a drain, wherein the source and drain of the seventh transistor are connected between ground and the gate of the fourth transistor, wherein the source and drain of the eighth transistor are connected between the gate and drain of the fourth transistor, wherein the gates of seventh and eighth transistors are connected to a second PWR signal terminal, wherein only one of the first and second PWR signal terminals is active at a time, wherein the fifth and seventh transistors comprise respective n-channel transistors, and wherein the sixth and eighth transistors comprise respective p-channel transistors.

12. The redundant system of claim 11 wherein the first potential terminal is at a non-zero potential when the second transistor is on and is otherwise at a zero potential, and wherein the second potential terminal is at a non-zero potential when the fourth transistor is on and is otherwise at a zero potential.

13. A method of controlling first and second cold spare circuits, wherein the first cold spare circuit comprises first and second transistors, wherein the first transistor has a gate, a source, and a drain, wherein the gate of the first transistor is controlled by a function of a first chip, wherein the second transistor has a gate, a source, and a drain, wherein the source and drain of the first transistor and the source and drain of the second transistor are connected in series between an output and a first potential terminal, wherein the second cold spare circuit comprises third and fourth transistors, wherein the third transistor has a gate, a source, and a drain, wherein the gate of the third transistor is controlled by a function of a second chip that is redundant of the first chip, wherein the fourth transistor has a gate, a source, and a drain, and wherein the source and drain of the third transistor and the source and drain of the fourth transistor are connected in series between the output and a second potential terminal, the method comprising:

controlling the second and fourth transistors so that only one of the first and second transistors is on at a time;

providing a non-zero potential to one of the first and second potential terminals corresponding to the one of the second and fourth transistors that is on; and, providing a zero potential to the other of the first and second potential terminals corresponding to the one of the second and fourth transistors that is off.

14. The method of claim 13 wherein the source of the second transistor is connected to the first potential terminal, wherein the drain of the second transistor is connected to the source of the first transistor, wherein the drain of the first transistor is connected to the output, wherein the source of the fourth transistor is connected to the second potential terminal, wherein the drain of the fourth transistor is connected to the source of the third transistor, and wherein the drain of the third transistor is connected to the output.

15. The method of claim 14 wherein the first cold spare circuit further comprises fifth and sixth transistors, wherein each of the fifth and sixth transistors comprises a gate, a source, and a drain, wherein the source and drain of the fifth transistor are connected between ground and the gate of the second transistor, wherein the source and drain of the sixth transistor are connected between the gate and drain of the second transistor, wherein the gates of fifth and sixth transistors are connected to a first PWR signal terminal, wherein the second cold spare circuit further comprises seventh and eighth transistors, wherein each of the seventh and eighth transistors comprises a gate, a source, and a drain, wherein the source and drain of the seventh transistor are connected between ground and the gate of the fourth transistor, wherein the source and drain of the eighth transistor are connected between the gate and drain of the fourth transistor, wherein the gates of seventh and eighth transistors are connected to a second PWR signal terminal, and wherein the controlling of the second and fourth transistors so that only one of the first and second transistors is on at a time comprises making one of the first and second PWR signal terminals active at a time.

16. The method of claim 13 wherein the first and second transistors comprise respective p-channel transistors.

17. The method of claim 16 wherein the source of the second transistor is connected to the first potential terminal, wherein the drain of the second transistor is connected to the source of the first transistor, wherein the drain of the first transistor is connected to the output, wherein the source of the fourth transistor is connected to the second potential terminal, wherein the drain of the fourth transistor is connected to the source of the third transistor, and wherein the drain of the third transistor is connected to the output.

18. The method of claim 17 wherein the first cold spare circuit further comprises fifth and sixth transistors, wherein each of the fifth and sixth transistors comprises a gate, a source, and a drain, wherein the source and drain of the fifth transistor are connected between ground and the gate of the second transistor, wherein the source and drain of the sixth transistor are connected between the gate and drain of the second transistor, wherein the gates of fifth and sixth transistors are connected to a first PWR signal terminal, wherein the second cold spare circuit further comprises seventh and eighth transistors, wherein each of the seventh and eighth transistors comprises a gate, a source, and a drain, wherein the source and drain of the seventh transistor are connected between ground and the gate of the fourth transistor, wherein the source and drain of the eighth transistor are connected between the gate and drain of the fourth transistor, wherein the gates of seventh and eighth transistors are connected to a second PWR signal terminal, wherein the fifth and seventh transistors comprise respective n-channel transistors, wherein the sixth and eighth transistors comprise respective p-channel transistors, and wherein the controlling of the second and fourth transistors so that only one of the first and second transistors is on at a time comprises making one of the first and second PWR signal terminals active at a time.

19. A method of controlling a cold spare circuit, wherein the cold spare circuit comprises first and second transistors, wherein the first transistor has a gate, a source, and a drain, wherein the gate of the first transistor is controlled by a function of a redundant chip, wherein the second transistor has a gate, a source, and a drain, wherein the source and drain of the first transistor and the source and drain of the second transistor are connected in series between an output and a potential terminal, the method comprising:

controlling the second transistor so that the cold spare circuit is on or off;

providing a non-zero potential to the potential terminal when the cold spare circuit is controlled to be on; and, providing a zero potential to the potential terminal when the cold spare circuit is controlled to be off.

20. The method of claim 19 wherein the source of the second transistor is connected to the potential terminal, wherein the drain of the second transistor is connected to the source of the first transistor, and wherein the drain of the first transistor is connected to the output.

21. The method of claim 20 wherein the cold spare circuit further comprises third and fourth transistors, wherein each of the third and fourth transistors comprises a gate, a source, and a drain, wherein the source and drain of the third transistor are connected between ground and the gate of the second transistor, wherein the source and drain of the fourth transistor are connected between the gate and drain of the second transistor, wherein the gates of third and fourth transistors are connected to a PWR signal terminal, and wherein the controlling of the second transistor comprises making the PWR signal terminal active when the cold spare circuit is on and making the PWR signal terminal inactive when the cold spare circuit is off.

22. The method of claim 21 wherein the first, second, and fourth transistors comprise respective p-channel transistors, and wherein the third transistor comprises an n-channel transistor.

* * * * *

UNITED STATES PATENT AND TRADEMARK OFFICE
CERTIFICATE OF CORRECTION

PATENT NO.     : 6,794,925 B1
DATED          : September 21, 2004
INVENTOR(S)    : David E. Fulkerson It is certified that error appears in the above-identified patent and that said Letters Patent is hereby corrected as shown below:

<u>Column 4,</u>
Line 42, change "its is corresponding" to -- its corresponding --.

Signed and Sealed this

Nineteenth Day of July, 2005

JON W. DUDAS
*Director of the United States Patent and Trademark Office*